US009142528B2

(12) United States Patent
Ng et al.

(10) Patent No.: US 9,142,528 B2
(45) Date of Patent: Sep. 22, 2015

(54) SEMICONDUCTOR DEVICE WITH AN INTERLOCKING STRUCTURE

(71) Applicant: Avago Technologies General IP (Singapore) Pte. Ltd., Singapore (SG)

(72) Inventors: Keat Chuan Ng, Penang (MY); Kiam Soon Ong, Penang (MY); Kheng Leng Tan, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/179,263

(22) Filed: Feb. 12, 2014

(65) Prior Publication Data

US 2015/0228611 A1 Aug. 13, 2015

(51) Int. Cl.
*H01L 23/52* (2006.01)
*H01L 23/00* (2006.01)
*H01L 33/62* (2010.01)

(52) U.S. Cl.
CPC .............. *H01L 24/70* (2013.01); *H01L 33/62* (2013.01)

(58) Field of Classification Search
USPC ............. 257/666–677, 99, 100, 796
See application file for complete search history.

(56) References Cited

U.S. PATENT DOCUMENTS 5,345,106 A * 9/1994 Doering et al. ............... 257/675
2013/0126916 A1 5/2013 Arai et al.

FOREIGN PATENT DOCUMENTS

CN 201204212 3/2009
EP 2533312 12/2012

OTHER PUBLICATIONS

"Die Attach Adhesive Solutions", available at www.aitechnology.com/products/dieattach/, Die Attach Adhesive Solutions, AI Technology, Inc., printed Jun. 26, 2013, 4 pages.

* cited by examiner

*Primary Examiner* — Jasmine Clark

(57) ABSTRACT

In one embodiment, a semiconductor device having a die attach pad, a semiconductor die and an adhesive material is disclosed. The adhesive material may be configured to adjoin the semiconductor die and the die attach pad. The die attach pad may be sandwiched between the semiconductor die and the die attach pad. In another embodiment, a device having a semiconductor die, a die attach glue and a die attach pad is disclosed. The device may comprise an interlock structure formed integrally with the die attach pad. In yet another embodiment, a light-emitting device comprising an interlock structure is disclosed.

20 Claims, 11 Drawing Sheets

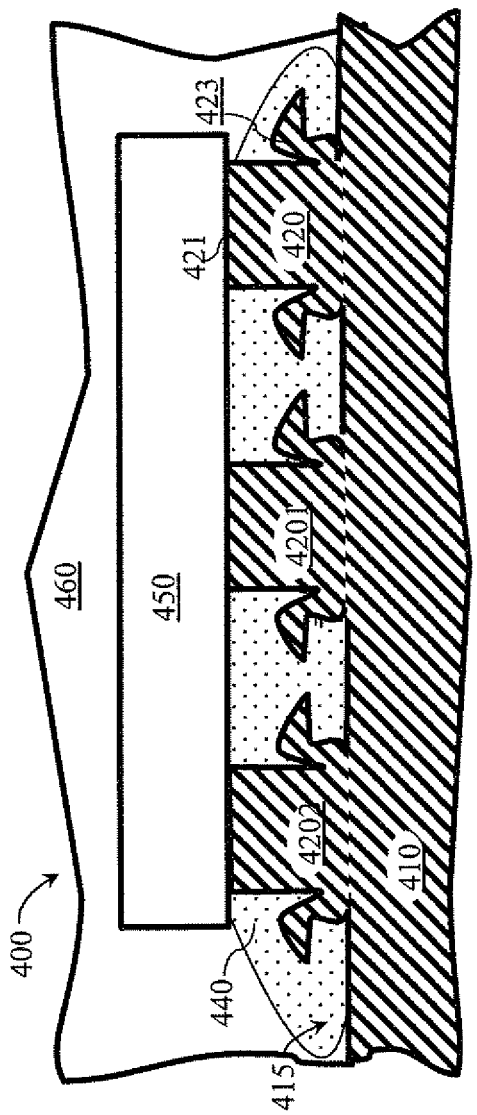
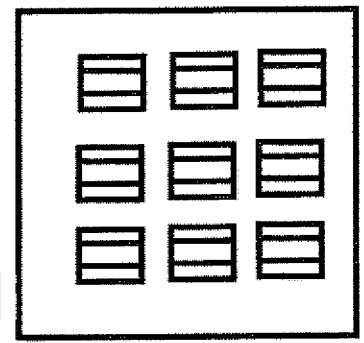
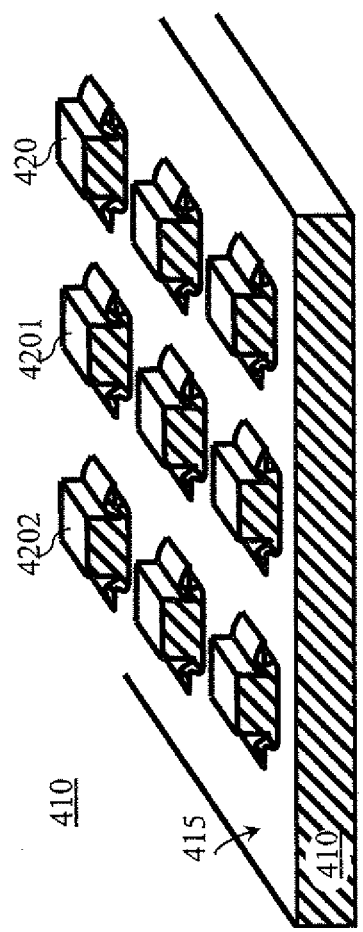
FIG. 4A
FIG. 4B
FIG. 4C

_US 9,142,528 B2_

SEMICONDUCTOR DEVICE WITH AN INTERLOCKING STRUCTURE

BACKGROUND

Semiconductor devices may be implemented using various packaging technologies such as a plastic leaded chip carrier (herein after PLCC) package, a ball grid array package (herein after BOA), a pin grid array package (herein after PGA), a quad flat pack (herein after QFP), a printed circuit board (herein after PCB) package and so on. Certain packages, for example PLCC packages in light-emitting devices, may comprise a lead frame over a molded polymer material such as Polyphthalamide (herein after PPA), Polyamide or Epoxy resin encapsulant like MG 97. For surface mount type, leads extending from the lead frame may be bent so that the semiconductor devices can be soldered on a substrate without through-holes. One of the most popular semiconductor devices may be opto-electronic device. One characteristic of opto-electronic devices may be the feature of having a light source die or a radiation source die. Example of opto-electronic devices may be opto-couplers, light emitting devices, proximity sensors, encoders and other similar devices having a radiation source.

One way many semiconductor devices fail reliability test may be due to delamination of encapsulant or epoxy material surrounding a semiconductor die. After going through hundreds or thousands of temperature cycles, some semiconductor dies may be lifted-up from the die attach pad, causing an open circuit. One explanation of the failure may be due to delamination of the epoxy material. Further, the failure rate may be higher for industrial or automotive use semiconductor devices, which may be required to operate at wide range of temperatures. Additionally, the failure rate for opto-electronic devices may be relatively higher due to the use of substantially transparent epoxy as encapsulant body. Most epoxy used in opto-electronic devices may be susceptible to delamination especially. The result may be that the entire transparent encapsulant body, as well as the light source die may be lifted up from the die attach pad more easily, compared to non-optics types of devices.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings may be for illustrative purpose to assist understanding and may not be drawn per actual scale. For example, the interlock structure of each embodiment may be drawn relatively larger than actual scale to enhance understanding of each feature or characteristic of the interlock structure.

FIG. 4A illustrates a cut-away cross-sectional view of a device having an interlock structure;

FIG. 4B illustrates a perspective view of the die attach pad shown in FIG. 4A;

FIG. 4C illustrates a top view of die attach pad of the device shown in FIG. 4A;

DETAILED DESCRIPTION

Figure 1:
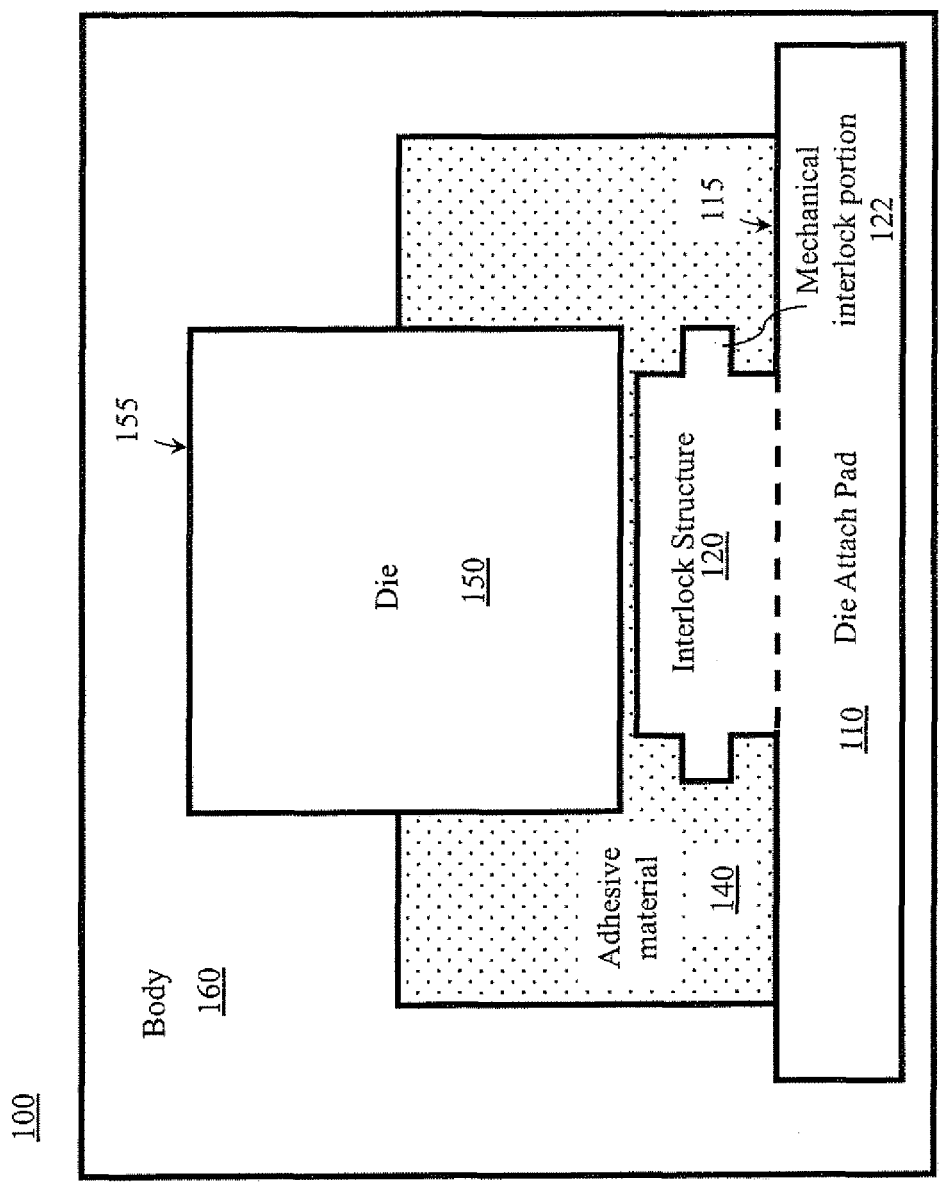
FIG. 1 shows an illustrative block diagram of a semiconductor device having an interlock structure.

FIG. 1 shows an illustrative block diagram of a semiconductor device 100. The semiconductor device 100 may be any electronic device having at least a semiconductor die. Examples of a semiconductor device may be an encoder, an application specific integrated circuit (also referred as "ASIC"), camera modules, opto-electronic devices such as opto-couplers, encoders, proximity sensors and any other similar devices having a die in a packaging. The semiconductor device 100 may comprise a die attach pad 110, an interlock structure 120, an adhesive material 140, a semiconductor die 150 and a body 160. The die attach pad 110 may comprise a major surface 115 for receiving the semiconductor die 150. The die attach pad 110 may be portion of a lead frame (not shown) encapsulated at least partially within the body 160. "Lead frame" (not shown) as used herein in reference to the semiconductor devices 100, refers to a structure capable of electrically connecting the semiconductor die 150 to an external power source or an external circuit (not shown). In PLCC packages, the lead frames may comprise a plurality of leads. The semiconductor device 100 in a PLCC package may comprise a plurality of leads encapsulated partially within a plastic body 160. One of the leads (not shown) may comprise the die attach pad 110 characterized by a widened portion to receive the semiconductor die 150.

In the embodiment shown in FIG. 1, the die attach pad 110 may be made of electrically and thermally conductive material, such as steel, copper, metal or a metal alloy, a metal compound or other similar materials. The die attach pad 110 may be formed using any stamping, cutting, etching or other similar process. The semiconductor die 150 may be attached on the die attach pad 110 via the adhesive material 140. The adhesive material 140 may be configured to adjoin the semiconductor die 150 and the die attach pad 110. For example, the adhesive material 140 may be applied to the major surface 115 of the die attach pad 110 first before the semiconductor die 150 is mounted to the die attach pad 110. The adhesive material 140 may be referred as "die attach glue" or "DA glue". The adhesive material 140 may comprise epoxy, silicone or other similar material that may be adhesive to adjoin the semiconductor die 150 to the die attach pad 110. The adhesive material 140 may comprise electrically conductive material. The adhesive material 140 may be in a substantially liquid form during the die attach process but may be subsequently cured into solid form. The adhesive material 140 may be opaque, but in another embodiment, the adhesive material 140 may be substantially transparent.

The die attach pad 110 may comprise the interlock structure 120. The interlock structure 120 may be integrally formed with the die attach pad 110. The interlock structure 120 may be sandwiched between the semiconductor die 150 and the major surface 115 of the die attach pad 110. The interlock structure 120 of the die attach pad 110 may be formed using any stamping, cutting, etching or other similar process to form a protruded structure from the die attach pad 110. As shown in FIG. 1, the interlock structure 120 may be an integral portion of the die attach pad 110 configured to provide a mechanical interlock between the die attach pad 110 and the adhesive material 140. Specifically, the interlock structure 120 may be shaped to comprise a mechanical interlock portion 122 for engaging the adhesive material 140. As shown in FIG. 1, the interlock structure 120 may be formed on the major surface 115.

The interlock structure 120 may engage the semiconductor die 150. As the adhesive material 140 may be applied to the die attach pad 110 first prior to the die attach process, a thin layer of the adhesive material 140 may be formed between the semiconductor die 150 and the die attach pad 110. The thin layer of the adhesive material 140 sandwiched between the semiconductor die 150 and the interlock structure 120 of the die attach pad 110 may be less than twenty microns so as to reduce packaging height. The adhesive material 140 may be configured to encapsulate the entire interlock structure 120 as shown in FIG. 1. In another embodiment with space constraints, the adhesive material 140 may encapsulate partially the interlock structure 120. Specifically, the adhesive material 140 may encapsulate the mechanical interlock portion 122 so as to establish the mechanical interlock. The adhesive material 140 may be for adjoining a surface of the semiconductor die 150 to the major surface 115 of the die attach pad 110. Hence, the adhesive material 140 may be applied to a lower portion of the semiconductor die 150. As illustrated in FIG. 1, the adhesive material 140 may be configured to surround the lower portion of the semiconductor die 150.

In one embodiment where the semiconductor die 150 comprises a light source, the adhesive material 140 may be substantially transparent. However, the adhesive material 140 may also be a substantially opaque material and may be configured to expose substantial portion of the semiconductor die 150 so as not to substantially block light emission. In another embodiment where the semiconductor die 150 comprise a photo-detector on a top surface 155 of the semiconductor die 150, the adhesive material 140 may be distanced away from the top surface 155 of the semiconductor die 150 such that light may be transmitted to the semiconductor die 150 without being blocked by the adhesive material 140. In yet another embodiment where the semiconductor die 150 is a light-emitting die, the adhesive material 140 that may be opaque may be covering less than 20% of the height of the semiconductor die 150 so as not to obstruct the light emission.

Figure 2A:
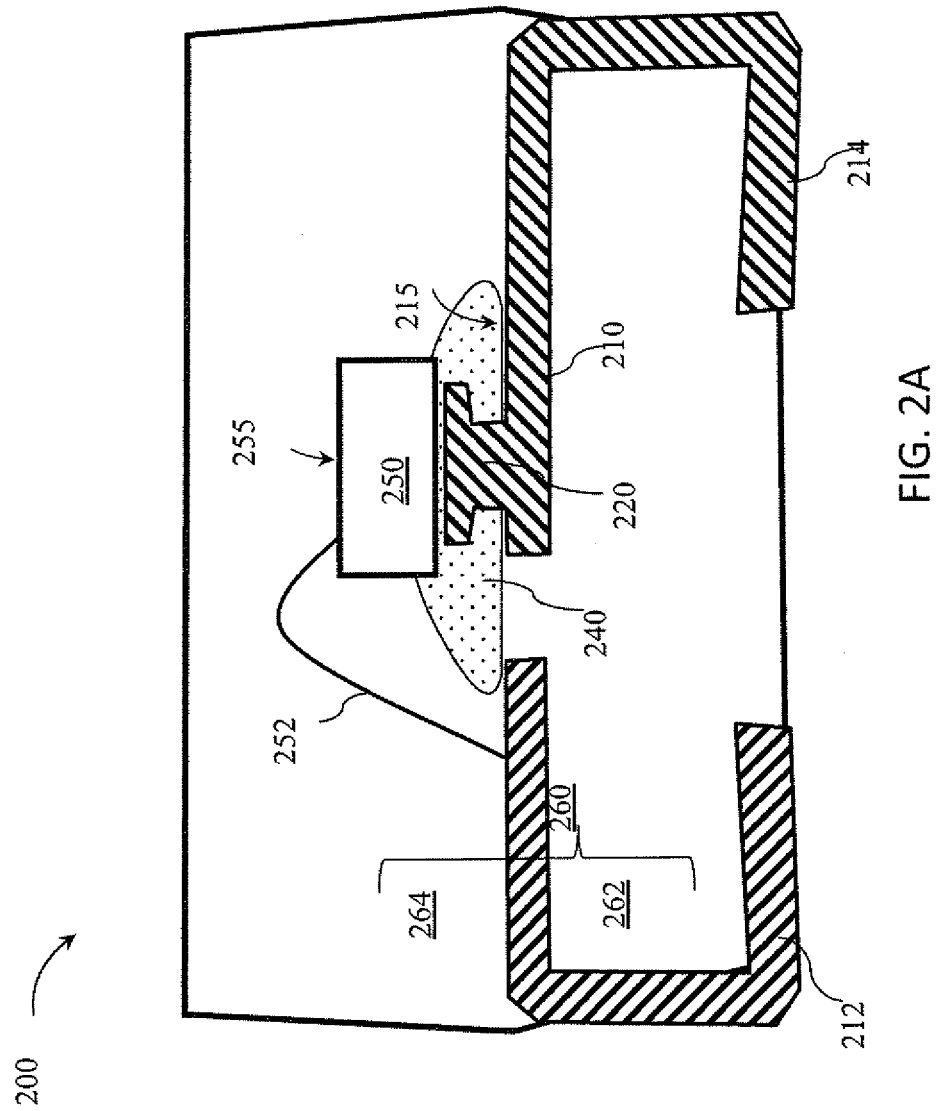
FIG. 2A illustrates a cross-sectional view of a semiconductor device having an interlock structure.

FIG. 2A illustrates a cross-sectional view of a semiconductor device 200. The semiconductor device 200 may comprise a plurality of leads 212, 214, a semiconductor die 250, and an encapsulant body 260. One of the leads 214 may comprise a die attach pad 210. The die attach pad 210 may comprise an interlock structure 220. The semiconductor die 250 may be mounted on a major surface 215 of the die attach pad 210. Specifically, the semiconductor die 250 may be mounted on the die attach pad 210 such that a bottom surface of the semiconductor die 250 may engage the interlock structure 220 of the die attach pad 215. An adhesive material 240 may be configured to adjoin the semiconductor die 250 and the die attach pad 210. Generally, the adhesive material 240 may be applied to the die attach pad 210 before the semiconductor die 250 may be mounted on the die attach pad 210. Thus, the adhesive material 240 may be usually formed between the semiconductor die 250 and the die attach pad 210. As shown in FIG. 2A, the interlock structure 220 of the die attach pad 210 may be sandwiched between the semiconductor die 250 and the major surface 215 of the die attach pad 210.

The interlock structure 220 may be an integral portion of the die attach pad 210 protruded from the major surface 215 of the die attach pad 210. The interlock structure 220 may be configured to provide a mechanical interlock between the die attach pad 210 and the adhesive material 250. Thus, the die attach pad 210 may be made from a similar material as the die attach pad 210 and may be substantially conductive electrically. The adhesive material 240 may be a die attach glue that may be substantially electrically conductive. Hence, the physical contact between the semiconductor die 210 and the interlock structure 220 of the die attach pad 210 or the adhesive material 240 may establish an electrical connection between the semiconductor die 250 and the lead 214.

Although one interlock structure 220 is shown in FIG. 2A, the semiconductor device 200 may comprise more than one interlock structure 220. Additional interlock structures 220 may increase mechanical interlock strength by providing more area for engaging the adhesive material 240. In addition, higher number of interlock structures 220 with similar height may reduce die placement accuracy requirement in manufacturing process. For example, the die attach pad 210 with one interlock structure 220 may have a requirement of 25 microns die placement tolerance relative to a designated location. However, a similar die attach pad 210 in another embodiment, having a plurality of similar interlock structures 220 arranged in array form covering the entire die attach pad 210, may have a requirement of 50 microns die placement tolerance relative to the designated location.

The plurality of leads 212, 214 may be employed to couple the semiconductor die 250 with an external circuit or to an external power source (not shown). The semiconductor die 250 may be coupled to the lead 212 through a bond wire 252 in addition to the electrical contact between the lead 214 and the semiconductor die 250. The plurality of lead 212, 214 may be a portion of a lead frame or a portion of conductive traces on a printed circuit board.

As shown in FIG. 2A, the encapsulant body 260 may comprise a lower portion 262 and an upper portion 264. The term "body" 260 as used herein in reference to a component of a semiconductor device 260 may refer to a respective primary structure, which provides structural support for other components of the semiconductor device 200. In FIG. 2A, the encapsulant body 260 may be epoxy, silicone or other encapsulant formed encapsulating or surrounding the plurality of leads 212, 214 and the semiconductor die 250 using an injection molding process or other similar processes. In another embodiment, the body 260 may be a substrate such as a PCB. The encapsulant body 260 may be an integral single piece structure formed using an opaque material such as PPA, polyamide, epoxy resin, plastic and other similar materials.

In another embodiment where the semiconductor device 200 comprises opto-electronic components, the upper portion 264 of the encapsulant body 260 may comprise a substantially transparent encapsulant formed encapsulating or surrounding the semiconductor die 250. For example, the semiconductor die 250 may be a top-emitting LED with the top surface 255 of the semiconductor die 250 remained optically unblocked as the upper portion 264 may be substantially transparent. The lower portion 262 of the encapsulant body 260 may be pre-formed and may be subsequently assembled to form the semiconductor device 200. The semiconductor device 200 having opto-electronic components may form a portion of a lighting system 290 as shown in FIG. 2B or may form a portion of an opto-electronic system 292 as shown in FIG. 2C. The embodiment in FIG. 2B illustrates a block diagram of a lighting system 290 having the semiconductor device shown in FIG. 2A, whereas FIG. 2C illustrates a block diagram of an opto-electronic system 292 having the semiconductor device 200 shown in FIG. 2A.

Figure 2D:
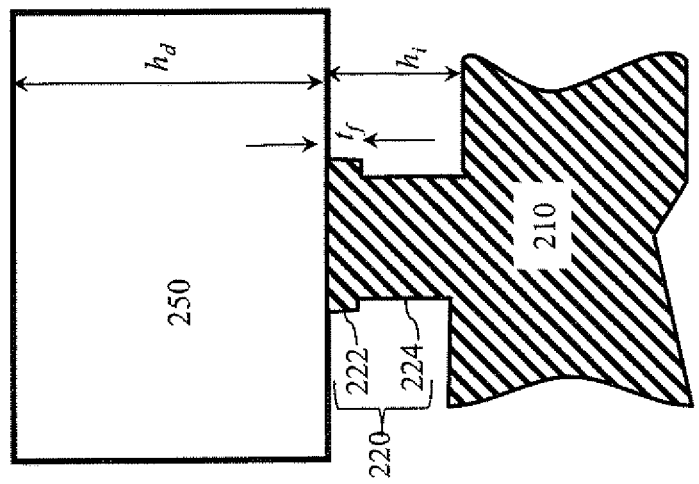
FIG. 2D illustrates an enlarged cross-sectional view of the interlock structure shown in FIG. 2A.
Figure 2B:
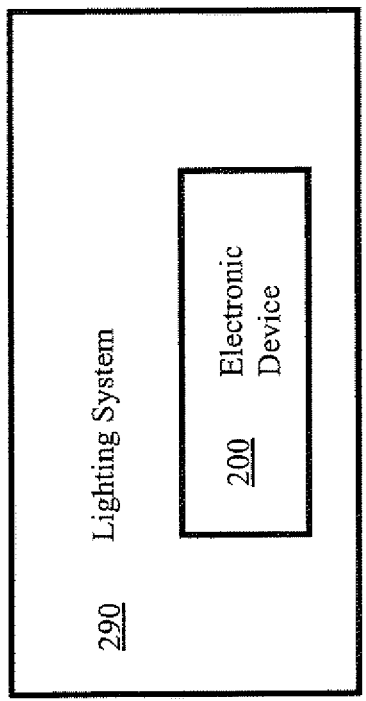
FIG. 2B illustrates a block diagram of a lighting system having the semiconductor device shown in FIG. 2A.
Figure 2C:
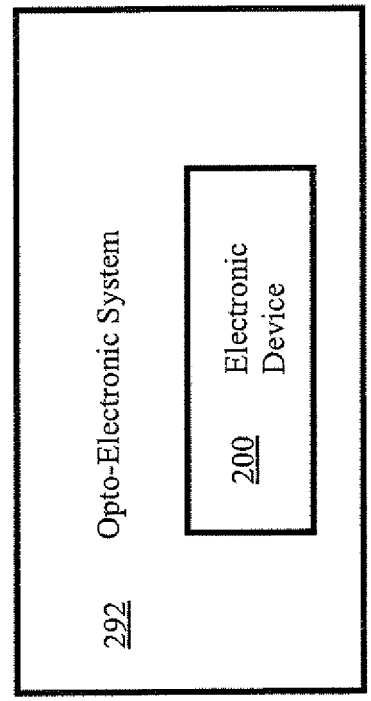
FIG. 2C illustrates a block diagram of an opto-electronic system having the semiconductor device shown in FIG. 2A.

FIG. 2D illustrates an enlarged cross-sectional view of the interlock structure 240 shown in FIG. 2A. For illustrative purpose, the interlock structure 240 may be drawn much larger than actual size. As shown in FIG. 2D, the interlock structure 220 may comprise a flange portion 222 and a neck portion 224. The flange portion 222 may be configured to provide the mechanical interlock. The neck portion 224 may be configured to adjoin the flange portion 222 and the die attach pad 210. As shown in FIG. 2D, the interlock structure 240 may have a height $h_i$, the semiconductor die 250 may have a height $h_d$ and the flange portion 222 may have a thickness $t_f$. The height $h_i$ of the interlock structure 240 may be substantially smaller compared to the height $h_d$ of the semiconductor die 250 so that the semiconductor die 250 may be mounted stably on the die attach pad 210. In one embodiment, the height $h_i$ of the interlock structure 240 may be approximately less than one tenth of the height $h_d$ of the semiconductor die 250. The height $h_i$ of the interlock structure 240 may be less than 0.1 mm. In another embodiment, the height $h_i$ of the interlock structure 240 may be approximately between 0.001 mm and 0.05 mm. The specific dimensions illustrated above may contribute towards adequate reliability performance without increasing packaging height substantially.

Referring to FIG. 2A and FIG. 2D, the flange portion 222 of the interlocking structure 220 may be configured to engage the adhesive material 240 so as to establish the mechanical interlock. Hence, dimensions of the flange portion 222 may require further consideration in order to ensure adequate hardness. In one embodiment, the thickness $t_f$ of the flange portion 222 may be approximately less than half of the height $h_i$ of the interlock structure 240. Keeping the ratio to be approximately half or slightly less than half may be beneficial to ensure sufficient strength of the interlock structure 222. For example, the flange portion 222 may be less than 0.01 mm while the height $h_i$ of the interlock structure 240 may be approximately 0.03 mm. The flange portion 222 may not be too thin because the flange portion 222 may break when the delamination occurs.

Figure 3A:
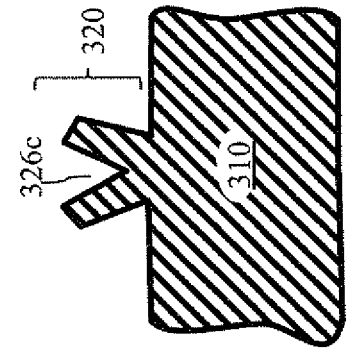
FIGS. 3A-3D illustrate various alternative embodiments of an interlock structure.
Figure 3B:
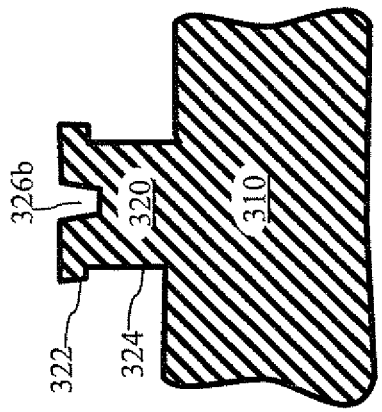
Figure 3C:
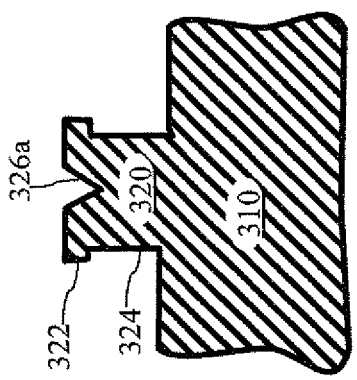
Figure 3D:
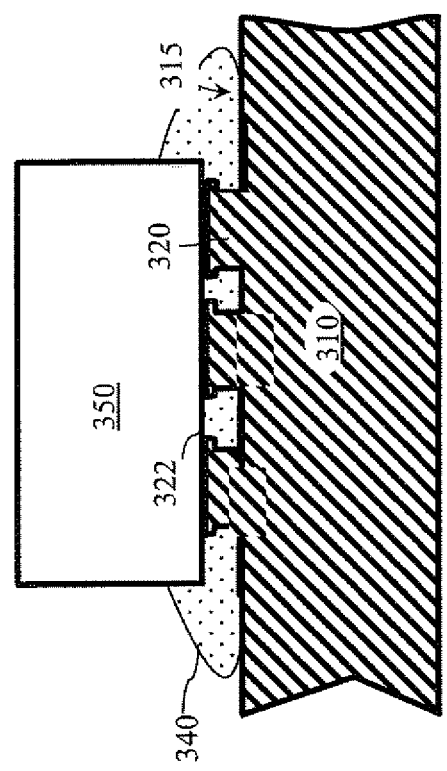

FIGS. 3A-3D illustrate various alternative embodiments of the interlock structure 220 shown in FIG. 2D. As shown in FIGS. 3A-3D, the interlock structure 320 of the die attach pad 310 may comprise a narrow portion 324 adjoining a widened portion 322. The widened portion 322 of the interlock structure 320 may be configured to engage a semiconductor die 250 as shown in FIG. 2A. In the embodiment shown in FIG. 3A, the widened portion 322 may comprise a groove 326a. The groove 326a may be a V-shape groove. Alternatively, as shown in FIG. 3B, the widened portion 322 may comprise a U-shape groove 326b. As shown in FIG. 3C, the interlock structure 320 may comprise a V-shape structure. The interlock structure 320 may be tapered. Specifically, the interlock structure 320 may comprise a widened end engaging the semiconductor die 250 shown in FIG. 2A and a narrow end adjoining the die attach pad 310. The interlock structure 320 shown in FIG. 3C may comprise a V-shape groove 326c. In the embodiment shown in FIG. 3D, the die attach pad 310 may comprise a plurality of interlock structures 320 to engage the semiconductor die 350. By supporting the semiconductor die 350 from multiple points, the plurality of interlock structures 320 may enable the semiconductor die 350 to be positioned in parallel with the major surface 315 of the die attach pad 310.

FIG. 4A illustrates a cut-away cross-sectional view of a device 400. The device 400 may comprise a die attach pad 410, a die attach surface 415, at least one interlock structure 420, a die attach glue 440, a semiconductor die 450 and an encapsulant 460. The interlock structure 420 may be formed on the die attach surface 415. In the embodiment shown in FIG. 4A, the at least one the interlock structure 420 may be an integral portion of the die attach pad 410. However, in another embodiment, the at least one interlock structure 420 may be soldered or attached to the die attach surface 415. The semiconductor die 450 may be mounted on the die attach surface 415 of the die attach pad 410. The die attach glue 440 may be configured to adjoin the semiconductor die 450 and the die attach pad 410. The die attach glue 440 may comprise substantially an adhesive material 440. In one embodiment, the die attach glue 440 may comprise electrically conductive material so as to provide electrical coupling between the semiconductor die 450 and the die attach pad 410.

As shown in FIG. 4A, the at least one interlock structure 420 may engage the semiconductor die 450. The at least one interlock structure 420 may be configured to provide a mechanical interlock between the die attach pad 410 and the die attach glue 440. As shown in FIG. 4A, the at least one interlock structure 420 may comprise a body portion 421 and a wing portion 423. The body portion 421 of the at least one interlock structure 420 may be configured to engage the semiconductor die 450 so as to provide structural support to the semiconductor die 450. The wing portion 423 of the at least one interlock structure 420 may be configured to engage the die attach glue 440 so as to provide a mechanical interlock between the die attach pad 410 and the die attach glue 440. For example, the wing portion 423 may extend in a direction substantially parallel to the die attach surface 415 so as to provide a mechanical interlock between the at least one interlock structure 420 and the die attach glue 440. More specifically, as shown in FIG. 4A, the wing portion 423 may comprise a bend such that a portion of the wing portion 423 may be substantially parallel to the die attach surface 415 for establishing the mechanical interlock.

FIG. 4B illustrates a perspective view of the die attach pad shown in FIG. 4A. FIG. 4C illustrates a top view of die attach pad 410 of the device shown in FIG. 4B. Referring to FIGS. 4A-4C, the device 400 may further comprise a plurality of additional interlock structures 4201-4202. The at least one interlock structure 420 and the plurality of additional interlock structures 4201-4202 may be arranged in an array. As shown in FIG. 4B and FIG. 4C, the at least one interlock structure 420 and the plurality of additional interlock structures 4201-4202 may be "island" type having sides with substantially equal length without being elongated.

Figure 5B:
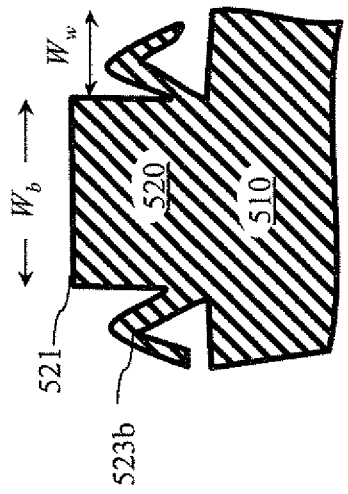
FIGS. 5A-5B illustrate various alternative embodiments of an interlock structure having a wing portion.
Figure 5A:
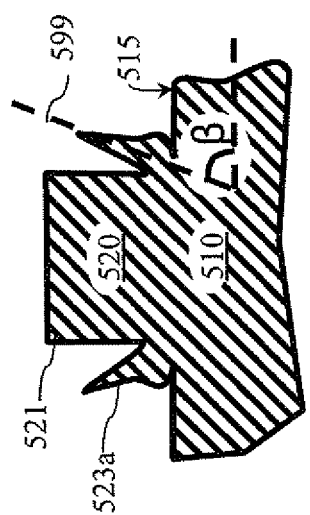

FIGS. 5A-5B illustrate various alternative embodiments of an interlock structure 520. In FIG. 5A, the interlock structure 520 of a die attach pad 510 may comprise a body portion 521 and a wing portion 523a projected longitudinally at an axis 599. As shown in FIG. 5A, each of the wing portion 523a and the axis 599 may form an angle β relative to the die attach surface 515 of the die attach pad 510. The angle β may be approximately less than eighty degree so as to establish relatively strong mechanical interlock. In FIG. 5B, the interlock structure 520 of the die attach pad 510 may comprise a body portion 521 and a wing portion 523b having a bent. The body portion 521 of the interlock structure 520 may have a width dimension $W_b$. The wing portion 523b may have width dimension $W_w$ that may be approximately less than half of the width dimension $W_b$ of the body portion 521 so as to ensure adequate structural strength of the wing portion 523b. The dimensions of the wing portion 523b, the body portion 521, as well as the angle β discussed above may increase the strength of mechanical interlock between the interlock structure 520 and the die attach glue 440 shown in FIG. 4A.

Figure 6B:
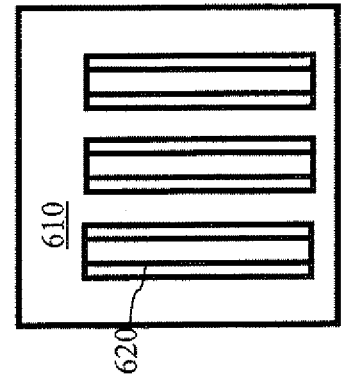
FIG. 6B illustrates a top view of the plurality of interlock structures shown in FIG. 6A.
Figure 6A:
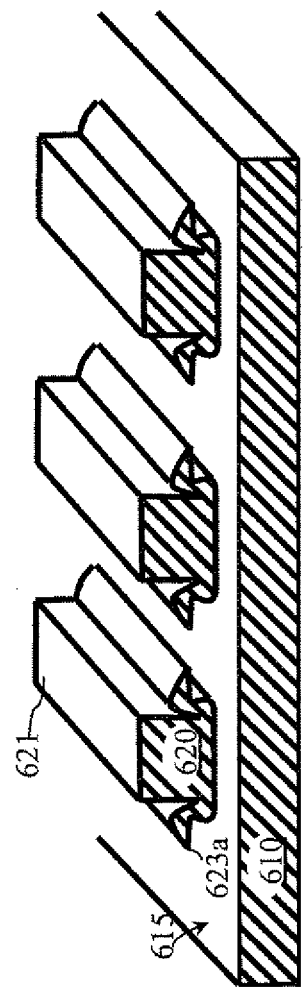
FIG. 6A illustrates a perspective view of a plurality of interlock structures having an elongated slab structure.

FIG. 6A illustrates a perspective view of a plurality of interlock structures 620. A top view of the plurality of interlock structures 620 is illustrated in FIG. 6B. The plurality of interlock structures 620 may be substantially similar to the interlock structures 420 shown in FIG. 4A but differs at least in that the interlock structures 620 may have an elongated slab structure compared to the "island" type structure shown in FIG. 4A. The elongated slab structure shown in FIG. 6A may be advantageous for engaging smaller semiconductor die 450 shown in FIG. 4A where space may be a constraint to accommodate a higher number of "island" type structure of interlock structures 420.

Figure 7B:
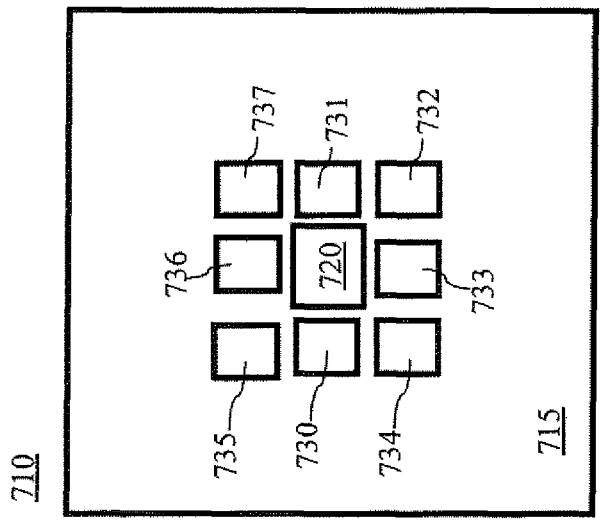
FIG. 7B illustrates a top view of die attach pad of the device shown in FIG. 7A.
Figure 7A:
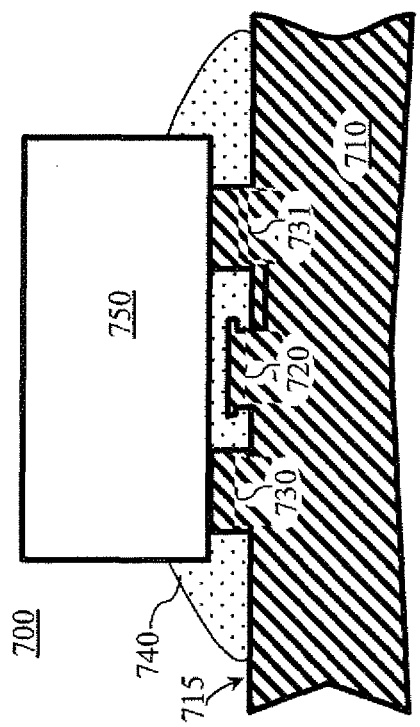
FIG. 7A illustrates a cross-sectional view of a device having at least one interlock structures and one body support structure having different heights.

FIG. 7A illustrates a cross-sectional view of a device 700 having at least one interlock structures 720 and one body support structure 730 with different heights. The device 700 may comprise a die attach pad 710, a semiconductor die 750, and a die attach glue 740 configured to adjoin the semiconductor die 750 to the die attach pad 710. The die attach pad 710 may comprise a die attach surface 715 configured to receive the semiconductor die 750. The die attach pad 710 may further comprise a body support structure 730 and the at least one interlock structure 720 so as to establish a mechanical interlock between the die attach pad 710 and the die attach glue 740.

Specifically, the die support structure 730 may be formed adjacent to the at least one interlock structure 720 on the die attach surface 715. The die support structure 730 may have higher height dimension relative to the at least one interlock structure 720 such that the die support structure 730 may be configured to engage the semiconductor die 740. With this arrangement, the at least one interlock structure 720 may be distanced away from the semiconductor die 750. However, similar to the previous embodiments the interlock structure 730 may be formed between the semiconductor die 750 and the die attach surface 715.

The at least one interlock structure 720 may comprise a flange similar to the embodiment shown in FIG. 2A. Alternatively, the at least one interlock structure 720 may comprise a wing portion similar to the embodiment shown in FIG. 4A. FIG. 7B illustrates a top view of die attach pad 710 of the device 700 shown in FIG. 7A. As shown in FIG. 7B, the die attach pad 710 may further comprise a plurality of additional die support structures 731-737 surrounding the at least one interlock structure 720 on the die attach surface 715.

In previous embodiments, the interlock structures 220, 320, 420, 720 shown in FIGS. 2A, 3A, 4A and 7A may be sandwiched between the die attach pads 210, 310, 410, 710 respectively so as to yield the die attach pads 210, 310, 410, 710 with relatively smaller size. However, the semiconductor dies 250, 350, 450, 750 may be positioned on the die attach pads 210, 310, 410, 710 respectively without the interlock structure 220, 320, 420, 720 being sandwiched between the semiconductor dies 250, 350, 450, 750 and the die attach pads 210, 310, 410, 710 so as to yield lower packaging heights as shown in FIG. 8 and FIG. 9.

Figure 8:
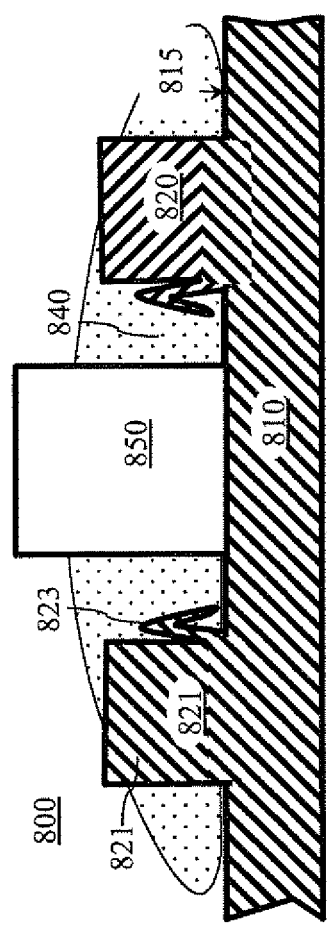
FIG. 8 illustrates a cross-sectional view of a device having a semiconductor die interposed between at least two interlock structures.

FIG. 8 illustrates a cross-sectional view of a device 800, The device 800 may comprise a die attach pad 810, a die attach glue 840, a semiconductor die 850 attached on a die attach surface 815 of the die attach pad 810. The die attach glue 840 may be configured to adjoin the semiconductor die 850 to the die attach pad 810. Optionally, the die attach pad 810 may comprise an additional interlock structure 821. As shown in FIG. 8, the semiconductor die 850 may be mounted on the die attach surface 815 of the die attach pad 810 adjacent to the interlock structure 820 of the die attach pad 810. The semiconductor die 850 may be interposed between the interlock structure 820 and the additional interlock structure 821 on the die attach surface 815 of the die attach pad 810.

Figure 9:
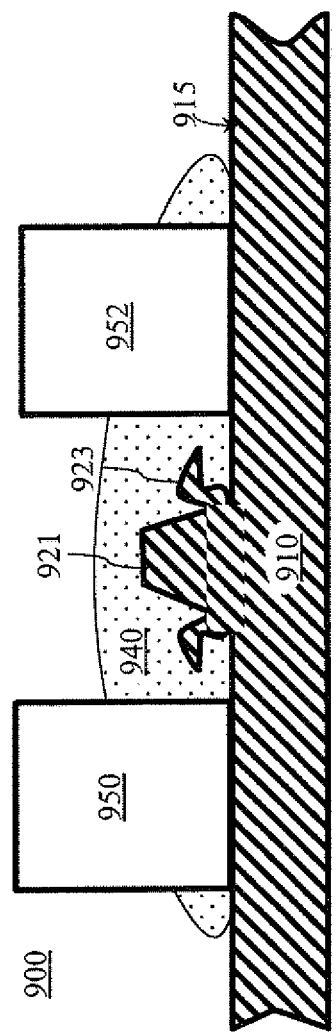
FIG. 9 illustrates a cross-sectional view of a device having an interlock structure semiconductor die interposed between at least two semiconductor dies.

FIG. 9 illustrates a cross-sectional view of a device 900. The device 900 may comprise a die attach pad 910, a die attach glue 940, a semiconductor die 950 attached on a die attach surface 915 of the die attach pad 910. The die attach glue 940 may be configured to adjoin the semiconductor die 950 to the die attach pad 910. Optionally, the device 900 may comprise an additional semiconductor die 952. As shown in FIG. 9, the semiconductor die 950 and the additional semiconductor die 952 may be mounted on the die attach surface 915 of the die attach pad 910 adjacent to the interlock structure 920 of the die attach pad 910. The interlock structure 920 may be interposed between the semiconductor die 950 and the additional semiconductor die 952 on the die attach surface 915 of the die attach pad 910.

Figure 10:
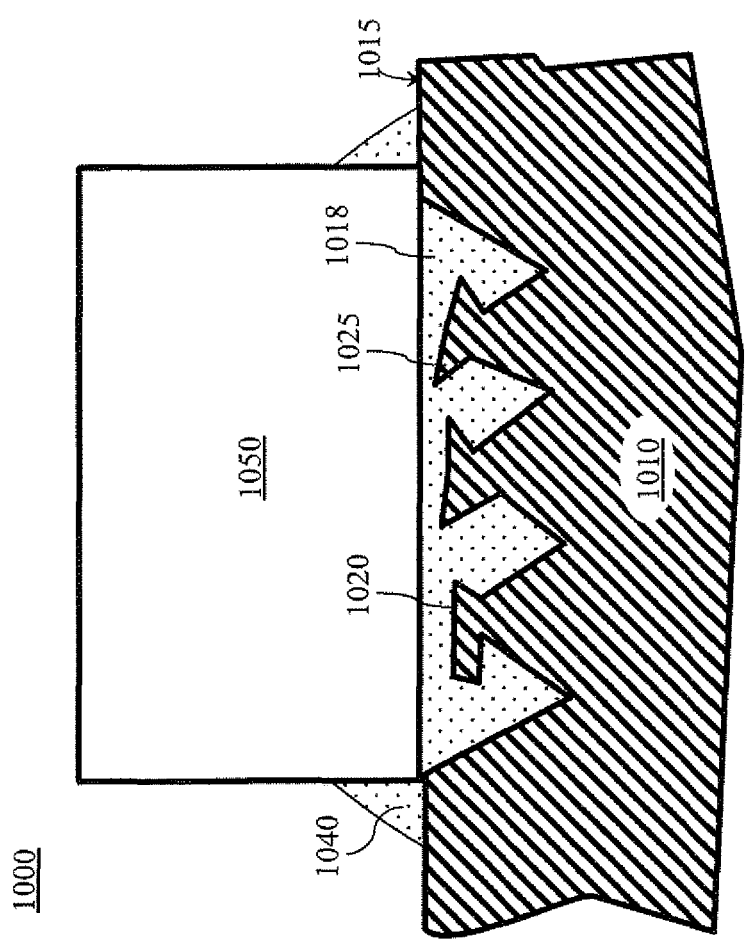
FIG. 10 illustrates a cross-sectional view of a device having at least one interlock structure formed beneath a die attach surface.

FIG. 10 illustrates a cross-sectional view of a device 1000. The device 1000 may comprise a die attach pad 1010, a die attach glue 1040, a semiconductor die 1050 attached on a die attach surface 1015 of the die attach pad 1010. The die attach glue 1040 may be configured to adjoin the semiconductor die 1050 to the die attach pad 1010. Optionally, the die attach pad 1010 of the device 1000 may comprise a groove 1018. The die attach pad 1010 may comprise at least one interlock structure 1020 formed within the groove 1018 beneath the die attach surface 1015 such that the interlock structure 1020 may be distanced away from the semiconductor die 1050. As shown in FIG. 10, the interlock structure 1020 may comprise a portion 1025 extends substantially in parallel to the die attach surface 1015 so as to establish a mechanical interlock with the die attach glue 1040.

Figure 11:
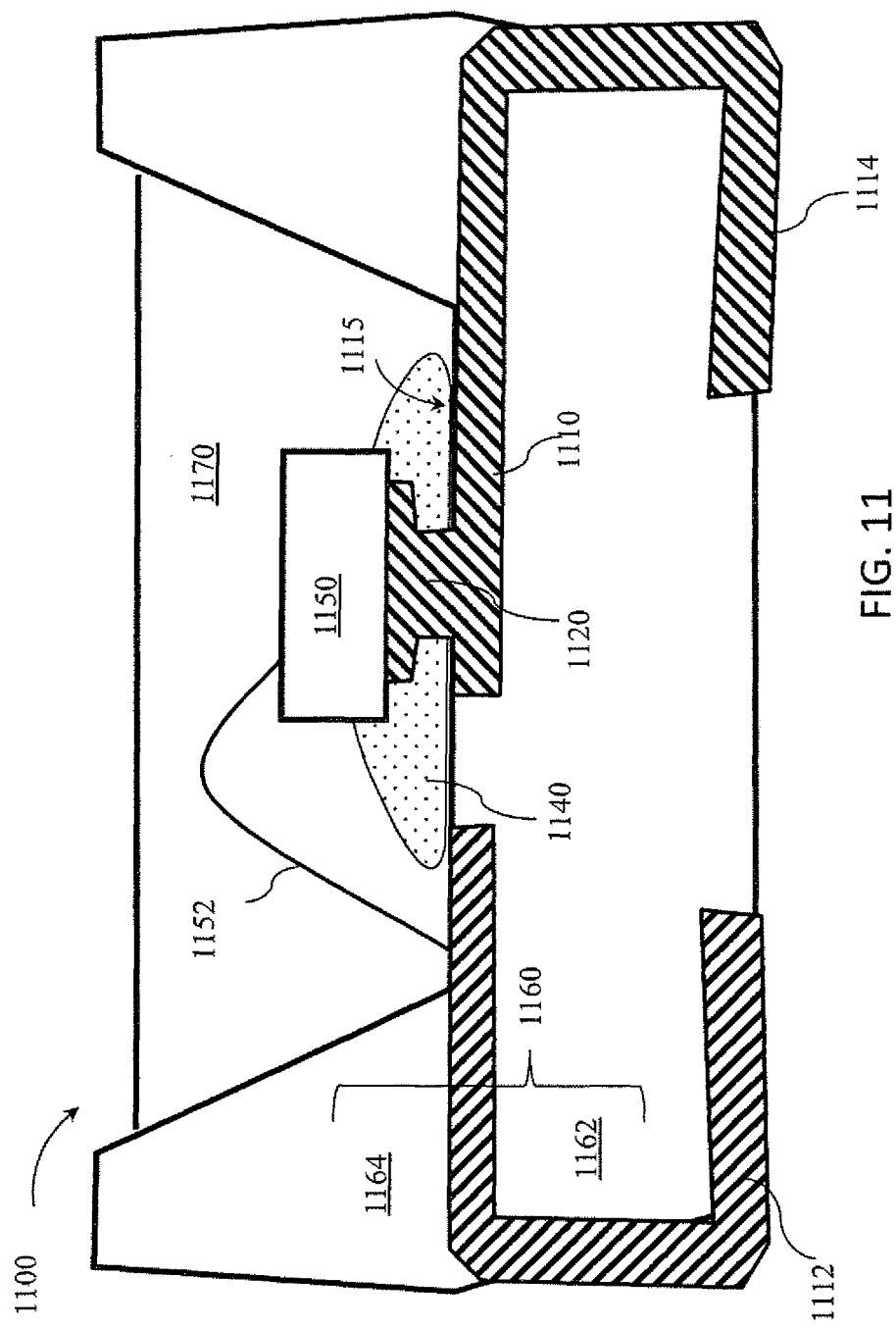
FIG. 11 illustrates a light-emitting device having an interlock structure formed within a groove.

FIG. 11 illustrates a cross-sectional view of a light-emitting device 1100. The light-emitting device 1100 may comprise a plurality of leads 1112, 1114, an emitter 1150, and an encapsulant body 1160. The plurality of leads 1112, 1114 may be electrically coupled to the emitter 1150. One of the plurality of leads 1114 may comprise a die attach pad 1110. The die attach pad 1110 may comprise an interlock structure 1120. The encapsulant body 1160 may comprise a lower portion 1162 and an upper portion 1164. The encapsulant body 1160 may be substantially reflective for reflecting light.

The emitter 1150 may be mounted on a major surface 1115 of the emitter 1150. Specifically, the emitter 1150 may be mounted on the die attach pad 1110 such that a bottom surface of the emitter 1150 may be engaging the interlock structure 1120 of the die attach pad 1110. An adhesive material 1140 may be configured to be in direct contact with a portion of the die attach pad 1110 and a portion of the emitter 1150 so as to adjoin the emitter 1150 and the die attach pad 1110. The adhesive material 1140, the emitter 1150 and a portion of the die attach pad 1110 may be encapsulated by a substantially transparent encapsulant 1170. The interlock structure 1120 of the die attach pad 1110 may be configured so as to mechanically adjoin the die attach pad 1110 and the adhesive material 1140.

Figure 12:
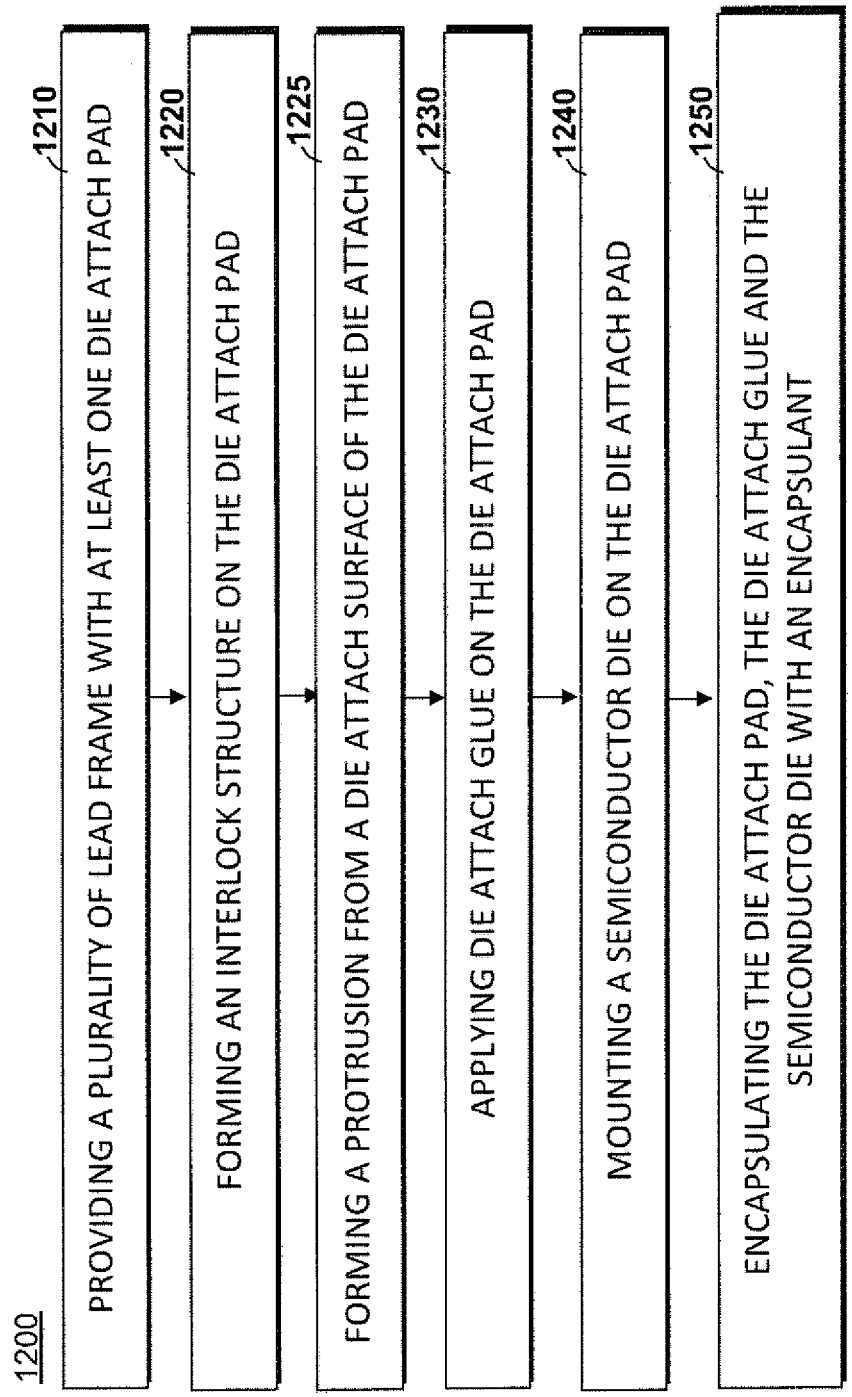
FIG. 12 illustrates a method for providing interlocking between die attach glue and the lead frame.

FIG. 12 illustrates a method 1200 for providing interlocking between die attach glue and the lead frame. In step 1210, a plurality of lead frame with at least one die attach pad may be provided. In step 1220, an interlock structure may be formed on the die attach pad. Step 1220 of forming an interlock structure on the die attach pad may comprise forming a protrusion from a die attach surface of the die attach pad as illustrated in optional step 1225. The method 1200 may then proceed to step 1230 in which a die attach glue may be applied on the die attach pad. Next, in step 1240 a semiconductor die may be mounted on the die attach pad. Optionally, the method may further comprise an optional step 1250 in which the die attach pad, the die attach glue and the semiconductor die may be encapsulated with an encapsulant.

Different aspects, embodiments or implementations may, but need not, yield one or more of the following advantages. For example, the shape, size various dimensions of the elements illustrated in various embodiments may be advantageous for increasing the strength of mechanical interlock between the die attach pad and the die attach glue or the adhesive material. In addition, various features illustrated in the Specification may be desirable for preventing failure due to delamination of epoxy that may result in failure of the devices. For example, the interlock structures illustrated throughout the Specification may improve reliability performance of many semiconductor devices, including opto-electronic devices.

Although specific embodiments of the invention have been described and illustrated herein above, the invention should not be limited to any specific forms or arrangements of parts so described and illustrated. For example, the interlock structure described above may be comprise substantially non-lead frame material or other material as known or later developed without departing from the spirit of the invention. The scope of the invention is to be defined by the claims appended hereto and their equivalents.

What is claimed is:

1. A semiconductor device, comprising:
   a die attach pad;
   a major surface of the die attach pad;
   a semiconductor die mounted on the major surface;
   an adhesive material configured to adjoin the semiconductor die and the die attach pad;
   an encapsulant covering the die attach pad, the adhesive material and the semiconductor die; and
   an interlock structure sandwiched between the semiconductor die and the major surface of the die attach pad,
   wherein the interlock structure is an integral portion of the die attach pad and the interlock structure engages the adhesive material so as to interlock the die attach pad and the adhesive material.

2. The semiconductor device of claim 1, wherein the adhesive material is formed between the semiconductor die and the die attach pad.

3. The semiconductor device of claim 1, wherein the interlock structure is a portion of the die attach pad protruded from the major surface of the die attach pad.

4. The semiconductor device of claim 1, wherein the interlock structure comprises a flange portion and a neck portion, wherein the neck portion adjoins the flange portion and the die attach pad.

5. The semiconductor device of claim 4, wherein the flange portion has a thickness, and wherein the thickness is approximately less than 0.01 mm.

6. The semiconductor device of claim 1, wherein the interlock structure comprises an elongated slab structure.

7. The semiconductor device of claim 1, wherein the interlock structure comprises a narrow portion adjoining a widened portion, and wherein the widened portion is configured to engage the semiconductor die.

8. The semiconductor device of claim 7, wherein the widened portion comprises a groove.

9. The semiconductor device of claim 1, wherein the interlock structure has a height of approximately between 0.001 mm and 0.05 mm.

10. The semiconductor device of claim 1 forms a portion of a lighting system.

11. A device, comprising:
    a die attach pad;
    a die attach surface of the die attach pad;
    an interlock structure formed on the die attach surface;
    a semiconductor die configured to be mounted on the die attach surface;
    a die attach glue configured to adjoin the semiconductor die and the die attach pad; and
    an encapsulant covering the die attach pad, the die attach glue and the semiconductor die,
    wherein the interlock structure is configured to engage the die attach glue so as to provide a mechanical interlock interlocking the die attach pad and the die attach glue.

12. The device of claim 11, wherein the die attach pad further comprises a die support structure formed adjacent to the interlock structure on the die attach surface, and wherein the die support structure is configured to engage the semiconductor die.

13. The device of claim 12, wherein the interlock structure is formed between the semiconductor die and the die attach surface, and wherein the interlock structure is distanced away from the semiconductor die.

14. The device of claim 11, wherein the semiconductor die is mounted on the die attach surface adjacent to the interlock structure.

15. The device of claim 14 further comprises an additional interlock structure, and wherein the semiconductor die is interposed between the interlock structure and the additional interlock structure.

16. The device of claim 14 further comprises an additional semiconductor die, and wherein the interlock structure is interposed between the semiconductor die and the additional semiconductor die.

17. The device of claim 11, wherein the interlock structure comprise a body portion configured to engage the semiconductor die, and a wing portion configured to engage the die attach glue so as to provide the mechanical interlock.

18. The device of claim 17, wherein the wing portion comprises a bend.

19. The device of claim 11, wherein the interlock structure is formed beneath the die attach surface and distanced away from the semiconductor die.

20. A light-emitting device, comprising
    a die attach pad;
    an emitter mounted on the die attach pad;
    a plurality of leads electrically coupled to the emitter;
    an adhesive material in direct contact with a portion of the die attach pad and the emitter so as to adjoin the emitter and the die attach pad; and a substantially transparent encapsulant encapsulating the emitter, the adhesive material and at least a portion of the die attach pad, wherein the die attach pad comprises an interlock structure providing a mechanical interlock with the adhesive material so as to mechanically adjoin the die attach pad and the adhesive material.

\* \* \* \* \*